(12) United States Patent
Yang et al.

(10) Patent No.: US 9,276,702 B2
(45) Date of Patent: *Mar. 1, 2016

(54) APPARATUS AND METHOD FOR TRANSMITTING AND RECEIVING AN APPLICATION LAYER-FORWARD ERROR CORRECTION PACKET IN MULTIMEDIA COMMUNICATION SYSTEM

(71) Applicant: Samsung Electronics Co., Ltd., Gyeonggi-do (KR)

(72) Inventors: Hyun-Koo Yang, Seoul (KR); Sung-Hee Hwang, Gyeonggi-do (KR); Seho Myung, Seoul (KR)

(73) Assignee: Samsung Electronics Co., Ltd (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/641,899

(22) Filed: Mar. 9, 2015

(65) Prior Publication Data

US 2015/0180609 A1 Jun. 25, 2015

Related U.S. Application Data

(63) Continuation of application No. 13/672,233, filed on Nov. 8, 2012, now Pat. No. 8,977,935.

(30) Foreign Application Priority Data

Nov. 8, 2011 (KR) .................. 10-2011-0116040
Oct. 8, 2012 (KR) .................. 10-2012-0111287

(51) Int. Cl.
*H03M 13/00* (2006.01)
*H04L 1/00* (2006.01)
*H03M 13/05* (2006.01)
*H03M 13/37* (2006.01)

(52) U.S. Cl.
CPC ............. *H04L 1/0041* (2013.01); *H03M 13/05* (2013.01); *H03M 13/373* (2013.01); *H03M 13/6362* (2013.01); *H04L 1/0057* (2013.01); *H04L 1/0065* (2013.01); *H04L 1/0068* (2013.01)

(58) Field of Classification Search
CPC ............. H03M 13/373; H03M 13/05; H03M 13/6362; H04L 1/0041; H04L 1/0057; H04L 1/0065; H04L 1/0068
See application file for complete search history.

(56) References Cited

U.S. PATENT DOCUMENTS 8,977,935 B2 * 3/2015 Yang et al. .................. 714/776
2007/0300127 A1 12/2007 Watson et al.
2011/0219279 A1 9/2011 Abu-Surra et al.

FOREIGN PATENT DOCUMENTS

EP         2 173 035       4/2010
KR      1020080084369      9/2008

OTHER PUBLICATIONS

Gozalvez et al., "AL-FEC for Improved Mobile Reception of MPEG-2 DVB-T Transport Streams", International Journal of Digital Multimedia Broadcasting, 2009.

(Continued)

*Primary Examiner* — Guerrier Merant
(74) *Attorney, Agent, or Firm* — The Farrell Law Firm, P.C.

(57) ABSTRACT

A method is provided for transmitting an Application Layer-Forward Error Correction (AL-FEC) packet by an AL-FEC packet transmission apparatus in a multimedia communication system. AL-FEC packets are generated. The AL-FEC packets are transmitted to an AL-FEC packet reception apparatus. Each of the AL-FEC packets includes an AL-FEC codeword symbol and an AL-FEC header, and the AL-FEC codeword symbol is one of AL-FEC codeword symbols included in an AL-FEC codeword block. The AL-FEC header includes order information indicating an order of an AL-FEC codeword symbol into which the AL-FEC header is inserted among the AL-FEC codeword symbols included in the AL-FEC codeword block.

28 Claims, 3 Drawing Sheets

(56) References Cited

OTHER PUBLICATIONS

Mammi et al., "Evaluation of AL-FEC Performance of IP Television Services QoS", Proceedings of SPIE-IS&T Electronic Imaging, SPIE vol. 7529, 2010.

Gerard Faria et al., "DVB-H: Digital Broadcast Services to Handheld Devices", Proceedings of the IEEE, vol. 94, No. 1, Jan. 2006.
European Search Report dated May 21, 2015 issued in counterpart application No. 12846899.8-1860.

* cited by examiner

APPARATUS AND METHOD FOR TRANSMITTING AND RECEIVING AN APPLICATION LAYER-FORWARD ERROR CORRECTION PACKET IN MULTIMEDIA COMMUNICATION SYSTEM

PRIORITY

This application is a Continuation Application of U.S. application Ser. No. 13/672,233, filed in the U.S. Patent and Trademark Office on Nov. 8, 2012, which claims priority under 35 U.S.C. §119(a) to Korean Patent Applications filed in the Korean Intellectual Property Office on Nov. 8, 2011 and assigned Serial No. 10-2011-0116040 and on Oct. 8, 2012 and assigned Serial No. 10-2012-0111287, the entire disclosures of which are hereby incorporated by reference.

BACKGROUND OF THE INVENTION

1. Field of the Invention

The present invention generally relates to an apparatus and method for transmitting and receiving a packet in a multimedia communication system, and more particularly, to an apparatus and method for transmitting and receiving an Application Layer-Forward Error Correction (AL-FEC) packet in a multimedia communication system.

2. Description of the Related Art

A multimedia communication system, such as a Moving Picture Experts Group (MPEG) Media Transport (MMT) system, provides various large-capacity content such as High Definition (HD) content, Ultra High Definition (UHD) content and the like.

According to diversification of content and increases in large-capacity content such as HD and UHD content in a multimedia communication system, data congestion has become a serious issue. Due to this, content transmitted by a signal transmission device may not be completely transferred to a signal reception device, and some of the content is lost en route.

In general, data is transmitted on a packet basis, and accordingly data loss is generated on a transmission packet basis. Accordingly, if the transmission packet is lost on a network, the signal reception device cannot receive the lost transmission packet, and thus cannot determine the meaning of data within the lost transmission packet. As a result, audio signal quality deterioration, video picture quality deterioration, video picture break, caption omission, file loss and the like, may occur.

Therefore, the MMT system may enhance a whole system reliability using various error-control schemes in order to reduce information data loss due to an error which may occur on a network according to channel status. A typical example of an error-control scheme is an Application Layer-Forward Error Correction (AL-FEC) scheme.

A multimedia communication system such as an MMT system requires usage of a Forward Error Correction (FEC) code supporting a codeword length and a code rate, which are varied according to a code rate and delay time required by a service.

If a conventional AL-FEC scheme is used, a signal transmission and reception apparatus should use different FEC codes according to a codeword length and a code rate, which increases the complexity of the MMT system making it difficult to implement the MMT system.

SUMMARY OF THE INVENTION

An aspect of an embodiment of the present invention is to provide an apparatus and method for transmitting and receiving an AL-FEC packet in a multimedia communication system.

Another aspect of an embodiment of the present invention is to provide an AL-FEC packet transmission and reception apparatus and method for supporting an FEC code supporting various codeword lengths in a multimedia communication system.

A further aspect of an embodiment of the present invention is to provide an AL-FEC packet transmission and reception apparatus and method for supporting an FEC code supporting various code rates in a multimedia communication system.

Still another aspect of an embodiment of the present invention is to provide an AL-FEC packet transmission and reception apparatus and method for supporting a packet basis puncturing in a multimedia communication system.

An additional aspect of an embodiment of the present invention is to provide an apparatus and method for normally transmitting and receiving an AL-FEC packet without transmitting puncturing information.

In accordance with one aspect of the present invention, a method is provided for transmitting an Application Layer-Forward Error Correction (AL-FEC) packet by an AL-FEC packet transmission apparatus in a multimedia communication system. AL-FEC packets are generated. The AL-FEC packets are transmitted to an AL-FEC packet reception apparatus. Each of the AL-FEC packets includes an AL-FEC codeword symbol and an AL-FEC header, and the AL-FEC codeword symbol is one of AL-FEC codeword symbols included in an AL-FEC codeword block. The AL-FEC header includes order information indicating an order of an AL-FEC codeword symbol into which the AL-FEC header is inserted among the AL-FEC codeword symbols included in the AL-FEC codeword block.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF EMBODIMENTS OF THE PRESENT INVENTION

Figure 1:
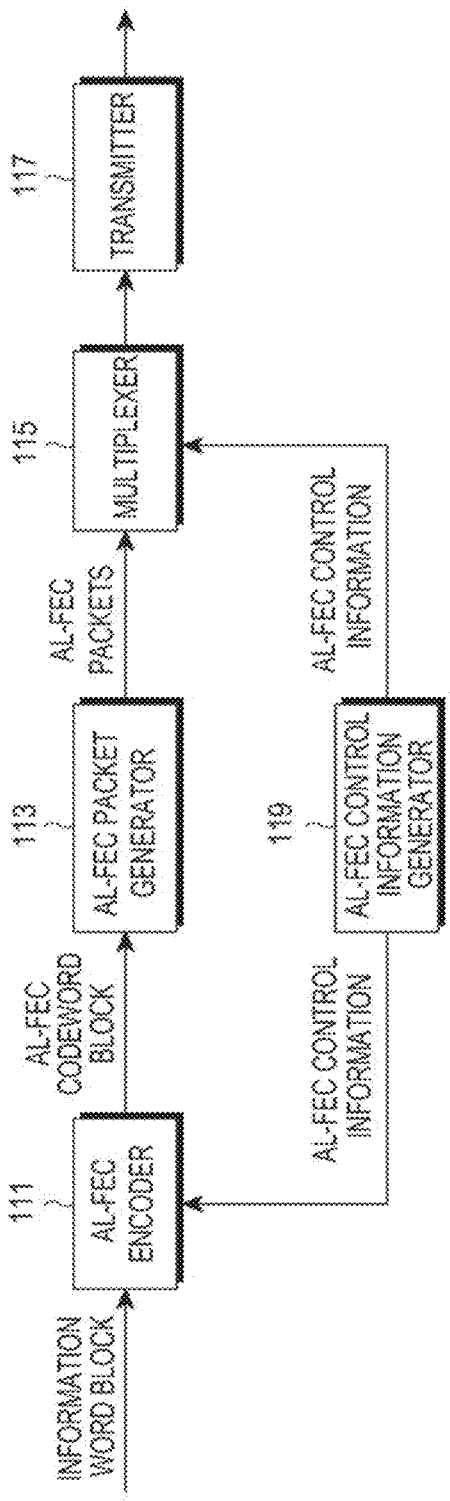
FIG. 1 is a block diagram illustrating an internal structure of an AL-FEC packet transmission apparatus in an MMT system according to an embodiment of the present invention.

Embodiments of the present invention will now be described in detail with reference to the accompanying drawings. In the following description, specific details such as detailed configuration and components are merely provided to assist the overall understanding of embodiments of the present invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

An embodiment of the present invention provides an apparatus and method for transmitting and receiving an Application Layer-Forward Error Correction (AL-FEC) packet in a multimedia communication system.

Another embodiment of the present invention provides an AL-FEC packet transmission and reception apparatus and method for supporting a Forward Error Correction (FEC) code supporting various codeword lengths in a multimedia communication system.

A further embodiment of the present invention provides an AL-FEC packet transmission and reception apparatus and method for supporting an FEC code supporting various code rates in a multimedia communication system.

Still another embodiment of the present invention provides an AL-FEC packet transmission and reception apparatus and method for supporting a packet basis puncturing in a multimedia communication system.

An additional embodiment of the present invention provides an apparatus and method for normally transmitting and receiving an AL-FEC packet without transmitting puncturing information.

Embodiments of the present invention will be described below with reference to a multimedia communication system, for example, a Moving Picture Experts Group (MPEG) Media Transport (MMT) system. However, it will be understood by those of ordinary skill in the art that the multimedia communication system may be other such systems, including any one of a Long-Term Evolution (LTE) mobile communication system, a Long-Term Evolution Advanced (LTE-A) mobile communication system and an Institute of Electrical and Electronics Engineers (IEEE) 802.16m communication system as well as the MMT system.

In an MMT system according to an embodiment of the present invention, a signal transmission apparatus uses a puncturing scheme, more particularly, a puncturing scheme in which a puncturing operation is performed on a packet basis in order to support an FEC code supporting various codeword lengths and code rates.

An FEC scheme, which is conventionally used in a physical layer, uses a puncturing scheme in which a puncturing operation is performed on a symbol basis. However, a puncturing scheme considering a use of an AL-FEC scheme, which a multimedia system such as an MMT system in the physical layer intends to use, is not considered.

Therefore, the present invention provides a method for using an AL-FEC scheme and supporting an FEC code supporting various codeword lengths and code rates.

The present invention also provides a method for enabling an AL-FEC packet transmission and reception that a signal reception apparatus may normally recover an FEC code without transmitting puncturing information in a signal transmission apparatus.

FIG. 1 is a block diagram illustrating an internal structure of an AL-FEC packet transmission apparatus in an MMT system according to an embodiment of the present invention.

Referring to FIG. 1, an AL-FEC packet transmission apparatus includes an AL-FEC encoder 111, an AL-FEC packet generator 113, a multiplexer 115, a transmitter 117, and an AL-FEC control information generator 119.

If an information word block occurs, the information word block is inputted to the AL-FEC encoder 111. The information word block includes k symbols. AL-FEC control information generated in the AL-FEC control information generator 119 is input to the AL-FEC encoder 111, and the AL-FEC control information includes (k,n,m) information and FEC code type information. Here, k denotes the number of information word symbols included in the information word block, n denotes the number of codeword symbols, i.e., AL-FEC codeword symbols, included in a codeword block, i.e., an AL-FEC codeword vector, m denotes the number of parity symbols included in a parity block, and the FEC code type information denotes a type of an FEC code. For example, the type of the FEC code may be one of a Low Density Parity Check (LDPC) code, a convolutional code, a turbo code, and a Reed Solomon (RS) code.

The AL-FEC encoder 111 generates an AL-FEC codeword block by encoding the information word block based on the AL-FEC control information, and outputs the AL-FEC codeword block to the AL-FEC packet generator 113. An internal structure and an operation of the AL-FEC encoder 111 will be described with reference to FIG. 2.

The AL-FEC packet generator 113 generates an AL-FEC packet by inserting a header into the AL-FEC codeword block outputted from the AL-FEC encoder 111, and outputs the AL-FEC packet to the multiplexer 115. An internal structure and an operation of the AL-FEC packet generator 113 will be described with reference to FIG. 3.

The multiplexer 115 generates a channel signal by multiplexing the AL-FEC packet output from the AL-FEC packet generator 113 and AL-FEC control information output from the AL-FEC control information generator 119 based on a preset multiplexing scheme, and outputs the channel signal to the transmitter 117. In FIG. 1, it is assumed that a channel through which the AL-FEC packet is transmitted is different from a channel through which the AL-FEC control information is transmitted, and the AL-FEC control information is transmitted through a channel having a minimum error occurrence probability, i.e., a maximum reliability. However, it will be understood by those of ordinary skill in the art that when the AL-FEC packet and the AL-FEC control information are transmitted through the same channel, a time interval during which the AL-FEC packet is transmitted is different from a time interval during which the AL-FEC control information is transmitted.

The transmitter 117 processes the channel signal output from the multiplexer 115 based on a preset transmission scheme and transmits the processed channel signal to a signal reception apparatus.

In FIG. 1, the AL-FEC control information generator 119 generates the AL-FEC control information, and outputs the AL-FEC control information to the AL-FEC encoder 111 and the multiplexer 115. However, it will be understood by those of ordinary skill in the art that the AL-FEC encoder 111 and the multiplexer 115 can prestore the AL-FEC control information, and in this case, the AL-FEC control information generator 119 is not implemented.

In FIG. 1, the multiplexer 115 generates the channel signal by multiplexing the AL-FEC packets and the AL-FEC control information, and the transmitter 117 transmits the channel signal. However, it will be understood by those of ordinary skill in the art that the transmitter 117 can transmit the AL-FEC packets and the AL-FEC control information without a multiplexing operation, and in this case, the multiplexer 115 is not implemented.

While the AL-FEC encoder 111, the AL-FEC packet generator 113, the multiplexer 115, the transmitter 117, and the AL-FEC control information generator 119 are shown in FIG. 1 as separate units, it is to be understood that this is merely for convenience of description. In other words, the AL-FEC encoder 111, the AL-FEC packet generator 113, the multiplexer 115, the transmitter 117, and the AL-FEC control information generator 119 may be incorporated into a single unit.

Figure 2:
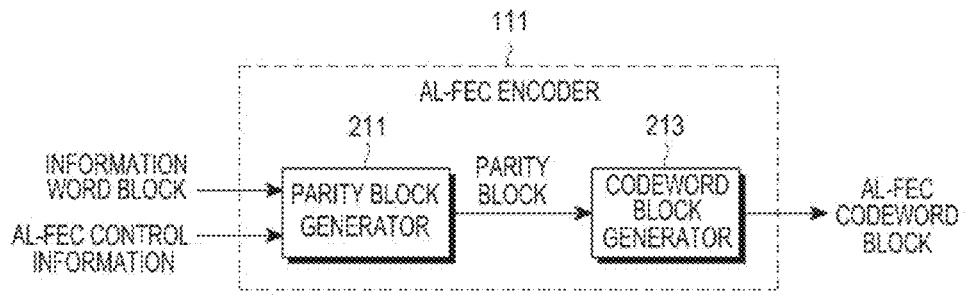
FIG. 2 is a block diagram illustrating an internal structure of AL-FEC encoder 111 in FIG. 1.

FIG. 2 is a block diagram illustrating an internal structure of AL-FEC encoder 111 in FIG. 1.

Referring to FIG. 2, AL-FEC encoder 111 includes a parity block generator 211 and a codeword block generator 213.

The parity block generator 211 converts input information word blocks into parity blocks according to AL-FEC control information, and outputs the parity block to the codeword block generator 213. Since the AL-FEC control information includes (k,n,m) information and the information word block includes k information word symbols, the parity block includes m parity symbols.

The codeword block generator 213 generates an AL-FEC codeword block including the information word block and the parity block, and outputs the AL-FEC codeword block to the AL-FEC packet generator 113. The AL-FEC codeword block includes n AL-FEC codeword symbols. Each of n AL-FEC codeword symbols may be one of an information word symbol and a parity symbol.

While the parity block generator 211 and the codeword block generator 213 are shown in FIG. 2 as separate units, it is to be understood that this is merely for convenience of description. In other words, the parity block generator 211 and the codeword block generator 213 may be incorporated into a single unit.

Figure 3:
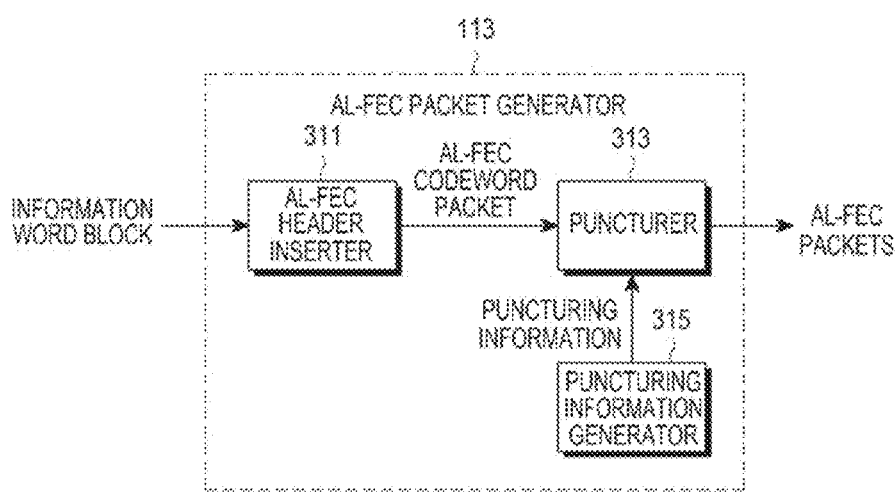
FIG. 3 is a block diagram illustrating an internal structure of AL-FEC packet generator 113 in FIG. 1.

FIG. 3 is a block diagram illustrating an internal structure of AL-FEC packet generator 113 in FIG. 1.

Referring to FIG. 3, AL-FEC packet generator 113 includes an AL-FEC header inserter 311, a puncturer 313, and a puncturing information generator 315.

The AL-FEC header inserter 311 generates n AL-FEC codeword packets by inserting an AL-FEC header into each of n AL-FEC codeword symbols included in an AL-FEC codeword block outputted from AL-FEC encoder 111, and outputs the n AL-FEC codeword packets to the puncturer 313. An AL-FEC codeword packet including the AL-FEC header and an AL-FEC information word symbol among AL-FEC codeword packets is called an AL-FEC source packet, and an AL-FEC codeword packet including the AL-FEC header and an AL-FEC parity symbol among AL-FEC codeword packets is called an AL-FEC parity packet. Thus, the AL-FEC codeword packet may be one of the AL-FEC source packet and the AL-FEC parity packet.

The AL-FEC header included in the AL-FEC source packet includes information necessary for detecting a codeword block included in the AL-FEC information word symbol included in the AL-FEC source packet and an accurate location on which the AL-FEC information word symbol included in the codeword block is arrayed in a signal reception apparatus. The AL-FEC header included in the AL-FEC parity packet includes information necessary for detecting a codeword block included in the AL-FEC parity symbol included in the AL-FEC parity packet and an accurate location on which the AL-FEC parity symbol included in the codeword block is arrayed in the signal reception apparatus. It will be understood by those of ordinary skill in the art that the AL-FEC source packet includes a plurality of AL-FEC information word symbols, and the AL-FEC parity packet includes a plurality of AL-FEC parity symbols. For convenience, in the present invention, it is assumed that the AL-FEC source packet includes one AL-FEC information word symbol and the AL-FEC parity packet includes one AL-FEC parity symbol.

The number of AL-FEC codeword packets output from the AL-FEC header inserter 311 is n. An AL-FEC header configuration method enabling acquisition of a location of an AL-FEC codeword symbol included in the AL-FEC codeword packet in the signal reception apparatus will now be described.

It is assumed that the signal reception apparatus may detect an AL-FEC codeword block included in an AL-FEC codeword symbol included in the AL-FEC codeword packet by using other information included in the AL-FEC header, or by performing a relatively simple calculation operation. The AL-FEC header includes a Serial Number (SN), and the AL-FEC header inserter 311 may allocate an SN using one of a first SN allocation scheme and a second SN allocation scheme.

First, a method of allocating an SN using the first SN allocation scheme in the AL-FEC header inserter 311 will be described.

An AL-FEC codeword block includes n AL-FEC codeword symbols, so the AL-FEC header inserter 311 sequentially allocates SNs to n AL-FEC codeword symbols. That is, SN=1 is allocated to the first AL-FEC codeword symbol, SN=2 is allocated to the second AL-FEC codeword symbol, and in this manner, SN=n is allocated to the nth AL-FEC codeword symbol.

Second, a method of allocating an SN using the second SN allocation scheme in the AL-FEC header inserter 311 will be described.

If the AL-FEC codeword block includes k AL-FEC information word symbols and m AL-FEC parity symbols, the AL-FEC header inserter 311 allocates SNs=1, 2, . . . , k to k AL-FEC information word symbols, and allocates SNs=k+1, k+2, . . . , n to m AL-FEC parity symbols. Here, m=n−k. That is, the AL-FEC header inserter 311 allocates SNs to AL-FEC codeword symbols, which are classified on a type basis, not to all AL-FEC codeword symbols. The AL-FEC header inserter 311 starts allocating SNs from AL-FEC information word symbols; however, it will be understood by those of ordinary skill in the art that the AL-FEC header inserter 311 can start allocating SNs from AL-FEC parity symbols, and an SN allocation order is established in advance between a signal transmission apparatus and a signal reception apparatus.

If the AL-FEC header inserter 311 allocates an SN using the second SN allocation scheme, a header included in the AL-FEC source packet further includes information indicating that the AL-FEC source packet includes an AL-FEC information word symbol, and a header included in the AL-FEC parity packet further includes information indicating that the AL-FEC parity packet includes an AL-FEC parity symbol. For example, the information indicating that the AL-FEC source packet includes the AL-FEC information word symbol and the information indicating that the AL-FEC parity packet includes the AL-FEC parity symbol may be transmitted through a payload Identifier (ID), and the AL-FEC header further includes the payload ID.

For example, a packet including the header is an AL-FEC source packet if a value of the payload ID is 0, and the packet including the header is an AL-FEC parity packet if the value of the payload ID is 1. That is, an AL-FEC header including (payload ID, SN) is inserted into each of AL-FEC codeword symbols if the AL-FEC header inserter 311 allocates an SN using the second SN allocation scheme.

That is, for example, when an AL-FEC header indicating (0, SN=1) is inserted into the first AL-FEC information word symbol, an AL-FEC header indicating (0, SN=2) is inserted into the second AL-FEC information word symbol, an AL-FEC header indicating (0, SN=k) is inserted into the kth AL-FEC information word symbol. That is, for example, when an AL-FEC header indicating (1, SN=1) is inserted into the first AL-FEC parity symbol, an AL-FEC header indicating (1, SN=2) is inserted into the second AL-FEC parity symbol, an AL-FEC header indicating (1, SN=k) is inserted into the kth AL-FEC parity symbol.

The (n, k, m) is inserted into the AL-FEC control information, however, it will be understood by those of ordinary skill in the art that the (n, k, m) is inserted into an AL-FEC header included in an AL-FEC codeword packet in order to quickly acquire the (n, k, m) in the signal reception apparatus.

For the case where the (n, k, m) is inserted into the AL-FEC header included in the AL-FEC codeword packet, a method for acquiring, by the signal reception apparatus, a location of an AL-FEC codeword symbol included in the AL-FEC codeword packet will now be described.

Upon receiving an AL-FEC codeword packet including an AL-FEC header indicating (1, SN=2), the signal reception apparatus detects that the AL-FEC codeword packet includes an AL-FEC parity symbol related to the (k+2)th AL-FEC codeword symbol.

Meanwhile, since an AL-FEC is a part of a transport protocol, features required in an AL-FEC header may be overlapped with features required in a header of the transport protocol. For example, information such as the payload ID may be used in a transport protocol using a scheme in which a Quality of Service (QoS) requirement criterion relatively higher than a QoS which is applied to an AL-FEC parity packet is allocated to an AL-FEC source packet. In this case, it may be desired that information such as the payload ID is included in a protocol header, not an AL-FEC header in view of division of roles between layers. In this case, a signal reception apparatus may acquire information corresponding to the payload ID from a protocol header and use the information even though the payload ID is omitted in the AL-FEC header.

The puncturer 313 inputs n AL-FEC codeword packets output from the AL-FEC header 311, punctures related AL-FEC codeword packets among n AL-FEC codeword packets based on the puncturing information output from the puncturing information generator 315, and outputs remained AL-FEC codeword packets to the multiplexer 115. An AL-FEC codeword packet output from the puncturer 313 is called an AL-FEC packet, and the puncturer 313 outputs n-p AL-FEC packets if the number of punctured AL-FEC codeword packets is p.

The AL-FEC packet transmission apparatus enables AL-FEC packet transmission and reception supporting an FEC code supporting various code lengths and code rates by performing the puncturing operation in the puncturer 313. In an embodiment of the present invention, an AL-FEC packet reception apparatus may recover an information word block even though the AL-FEC packet transmission apparatus does not transmit puncturing information for the puncturing operation to the AL-FEC packet reception apparatus.

In an embodiment of the present invention, the AL-FEC packet transmission apparatus does not transmit the puncturing information, so resource waste and signaling overhead due to the puncturing information transmission may be prevented. It will be understood by those of ordinary skill in the art that the puncturing information is determined based on a characteristic of an FEC code, channel status, buffer capability of a receiver, and the like.

In FIG. 3, the puncturing information generator 315 generates the puncturing information and outputs the puncturing information to the puncturer 313. However, it will be understood by those of ordinary skill in the art that the puncturer 313 can prestore the puncturing information, and in this case, the puncturing information generator 315 is not implemented.

The AL-FEC packet transmission apparatus knows AL-FEC parity symbols to be punctured before generating AL-FEC packets, so the AL-FEC header inserter 311 may allocate SNs by considering AL-FEC parities to be punctured. That is, the AL-FEC header inserter 311 allocates SNs to AL-FEC codeword symbols except for AL-FEC codeword symbols to be punctured among AL-FEC codeword symbols included in the AL-FEC codeword block. In this case, the AL-FEC encoder 111 and the AL-FEC header inserter 311 perform the puncturing operation performed in the puncturer 313, even though the puncturer 313 does not perform puncturing operation.

Although not shown in FIG. 3, the AL-FEC packet generator may include a storage unit for storing the AL-FEC codeword packets that the puncturer 313 punctures for additional transmission.

While the AL-FEC header inserter 311, the puncturer 313, and the puncturing information generator 315 are shown in FIG. 3 as separate units, it is to be understood that this is merely for convenience of description. In other words, the AL-FEC header inserter 311, the puncturer 313, and the puncturing information generator 315 may be incorporated into a single unit.

Figure 4:
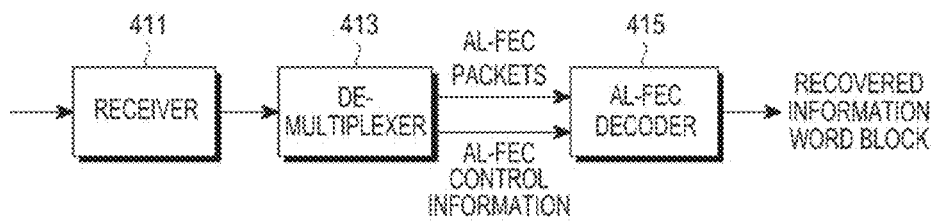
FIG. 4 is a block diagram illustrating an internal structure of an AL-FEC packet reception apparatus in an MMT system according to an embodiment of the present invention.

FIG. 4 is a block diagram illustrating an internal structure of an AL-FEC packet reception apparatus in an MMT system according to an embodiment of the present invention.

Referring to FIG. 4, an AL-FEC packet reception apparatus includes a receiver 411, a de-multiplexer 413, and an AL-FEC decoder 415.

Upon receiving a signal, the receiver 411 generates a channel signal by processing the received signal based on a preset reception scheme and outputs the channel signal to the de-multiplexer 413.

The de-multiplexer 413 detects AL-FEC packets and AL-FEC control information by de-multiplexing the channel signal output from the receiver 411 based on a preset de-multiplexing scheme, and outputs the AL-FEC packets and the AL-FEC control information to the AL-FEC decoder 415. The de-multiplexing scheme is determined according to a multiplexing scheme used in a multiplexer 115 included in the AL-FEC packet transmission apparatus.

The AL-FEC decoder 415 recovers an information word block by decoding the AL-FEC packets based on the AL-FEC control information. As described in FIG. 3, each of the AL-FEC packets includes an AL-FEC header including an SN, or an AL-FEC header including a payload ID and an SN, so the AL-FEC decoder 415 may normally recover an information word block without receiving puncturing information from the AL-FEC packet transmission apparatus. That is, the AL-FEC decoder 415 may detect a punctured AL-FEC packet using the SN, or the payload ID and the SN, and may normally recover the information word block without the puncturing information.

In FIG. 4, de-multiplexer 413 separates the AL-FEC packets and the AL-FEC control information. However, it will be understood by those of ordinary skill in the art that if an AL-FEC packet transmission apparatus does not perform a multiplexing operation, the de-multiplexer 413 is not implemented. While the receiver 411, the de-multiplexer 413, and the AL-FEC decoder 415 are shown in FIG. 4 as separate units, it is to be understood that this is merely for convenience of description. In other words, the receiver 411, the de-multiplexer 413, and the AL-FEC decoder 415 may be incorporated into a single unit.

Figure 5:
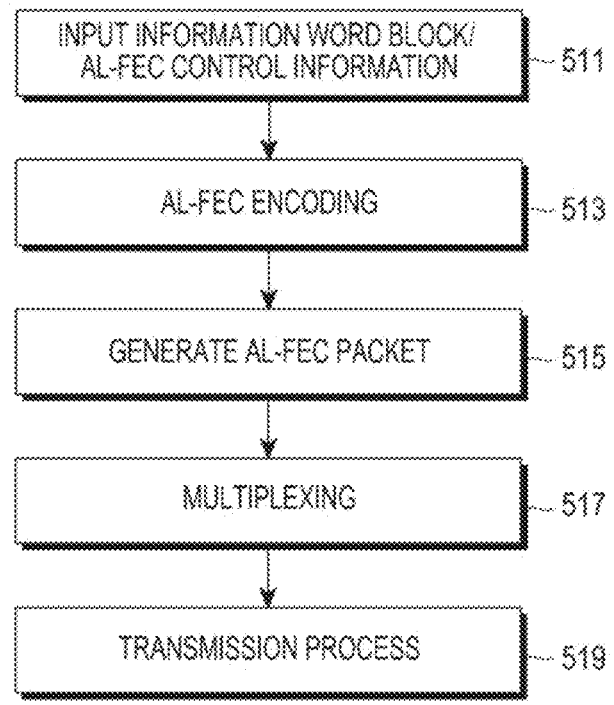
FIG. 5 is a flowchart illustrating an operating process in an AL-FEC packet transmission apparatus of an MMT system according to the present invention.

FIG. 5 is a flowchart illustrating an operating process in an AL-FEC packet transmission apparatus of an MMT system according to the present invention.

Referring to FIG. 5, the AL-FEC packet transmission apparatus inputs an information word block including k information word symbols and AL-FEC control information in step 511. The AL-FEC packet transmission apparatus generates an AL-FEC codeword block including n AL-FEC codeword symbols by AL-FEC encoding the information word block based on the AL-FEC control information in step 513. The AL-FEC codeword block includes k AL-FEC information word symbols and m AL-FEC parity symbols.

The AL-FEC packet transmission apparatus generates n AL-FEC codeword packets by inserting an AL-FEC header into each of n AL-FEC codeword symbols included in the AL-FEC codeword block, and generates n-p AL-FEC packets by puncturing p AL-FEC codeword packets among n AL-FEC codeword packets based on puncturing information in step 515. The AL-FEC packet transmission apparatus generates a channel signal by multiplexing n-p AL-FEC packets and the AL-FEC control information based on a preset multiplexing scheme in step 517. The AL-FEC packet transmission apparatus transmits the channel signal to an AL-FEC packet reception apparatus based on a preset transmission scheme in step 519.

Figure 6:
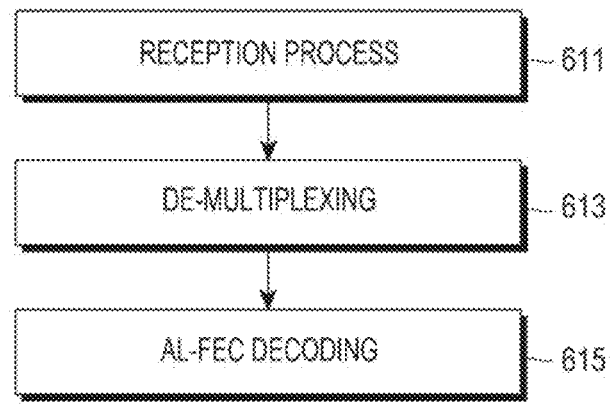
FIG. 6 is a flowchart illustrating an operating process in an AL-FEC packet reception apparatus of an MMT system according to the present invention.

FIG. 6 is a flowchart illustrating an operating process in an AL-FEC packet reception apparatus of an MMT system according to the present invention.

Referring to FIG. 6, the AL-FEC packet reception apparatus receives a signal, and generates a channel signal by processing the received signal based on a preset reception scheme in step 611. The AL-FEC packet reception apparatus detects AL-FEC packets and AL-FEC control information by de-multiplexing the channel signal based on a preset de-multiplexing scheme in step 613. If the AL-FEC packets are received AL-FEC packets, and the maximum number of the received AL-FEC packets is n-p and may be decreased according to channel status.

The AL-FEC packet reception apparatus recovers an information word block including k AL-FEC information word symbols by AL-FEC decoding the received AL-FEC packets based on the AL-FEC control information in step 615. The AL-FEC packet reception apparatus may detect which AL-FEC packets among n AL-FEC packets are punctured using an SN included in an AL-FEC header included in each of n-p AL-FEC packets and normally recover the information word block without receiving puncturing information from an AL-FEC transmission apparatus.

As is apparent from the foregoing description, embodiments of the present invention enable AL-FEC packet transmission and reception for supporting an FEC code having various codeword lengths in a multimedia communication system. Embodiments of the present invention enable AL-FEC packet transmission and reception for supporting an FEC code having various code rates in a multimedia communication system. Embodiments of the present invention enable AL-FEC packet transmission and reception for supporting a packet basis puncturing in a multimedia communication system. Embodiments of the present invention enable normal AL-FEC packet transmission and reception without transmitting puncturing information.

While the invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A method for transmitting an application layer-forward error correction (AL-FEC) packet by an AL-FEC packet transmission apparatus in a multimedia communication system, comprising:
   generating, by the AL-FEC packet transmission apparatus, an AL-FEC packet; and
   transmitting, by the AL-FEC packet apparatus, the AL-FEC packet to an AL-FEC packet reception apparatus,
   wherein the AL-FEC packet includes AL-FEC codeword symbols and an AL-FEC header, and each of the AL-FEC codeword symbols is one of AL-FEC codeword symbols included in an AL-FEC codeword block, and
   wherein the AL-FEC header includes order information indicating an order of the AL-FEC codeword symbols included in the AL-FEC packet in the AL-FEC codeword block.

2. The method as claimed in claim 1, wherein:
   the order information includes a serial number (SN) indicating an order of a related AL-FEC codeword symbol, and
   the SN is sequentially allocated for all of the AL-FEC codeword symbols included in the AL-FEC codeword block, or the SN is sequentially allocated for AL-FEC codeword symbols that are classified on a type basis among the AL-FEC codeword symbols included in the AL-FEC codeword block.

3. The method as claimed in claim 2, wherein the AL-FEC header further includes information indicating a type of the AL-FEC codeword symbol included in the AL-FEC packet if the SN is sequentially allocated for the AL-FEC codeword symbols which are classified on a type basis.

4. The method as claimed in claim 1, wherein:
   the order information includes an SN indicating an order of a related AL-FEC codeword symbol,
   the SN is sequentially allocated for all of the AL-FEC codeword symbols included in the AL-FEC codeword block, or the SN is sequentially allocated for AL-FEC codeword symbols which are classified on a type basis among the AL-FEC codeword symbols included in the AL-FEC codeword block if the AL-FEC packet transmission apparatus generates AL-FEC codeword packets, and generates the AL-FEC packets by performing a puncturing operation based on puncturing information, and
   each of the AL-FEC codeword packets includes a related AL-FEC codeword symbol and AL-FEC header.

5. The method as claimed in claim 4, wherein the AL-FEC header further includes information indicating a type of the AL-FEC codeword symbol included in the AL-FEC packet if the SN is sequentially allocated for the AL-FEC codeword symbols which are classified on a type basis.

6. The method as claimed in claim 1, wherein:
   the order information includes an SN indicating an order of a related AL-FEC codeword symbol, and
   the SN is sequentially allocated for specific AL-FEC codeword symbols among the AL-FEC codeword symbols included in the AL-FEC codeword block, or the SN is sequentially allocated for AL-FEC codeword symbols which are classified on a type basis among the specific AL-FEC codeword symbols if the AL-FEC packet transmission apparatus allocates the SN for the specific AL-FEC codeword symbols based on puncturing information.

7. The method as claimed in claim 6, wherein the AL-FEC header further includes information indicating a type of the AL-FEC codeword symbol included in the AL-FEC packet if the SN is sequentially allocated for the AL-FEC codeword symbols which are classified on a type basis.

8. A method for receiving an application layer-forward error correction (AL-FEC) packet by an AL-FEC packet reception apparatus in a multimedia communication system, comprising:
  receiving, by the AL-FEC packet reception apparatus, an AL-FEC packet,
  wherein the AL-FEC packet includes AL-FEC codeword symbols and an AL-FEC header, and each of the AL-FEC codeword symbols is one of AL-FEC codeword symbols included in an AL-FEC codeword block, and
  wherein the AL-FEC header includes order information indicating an order of the AL-FEC codeword symbols included in the AL-FEC packet in the AL-FEC codeword block.

9. The method as claimed in claim 8, wherein:
  the order information includes a serial number (SN) indicating an order of a related AL-FEC codeword symbol, and
  the SN is sequentially allocated for all of the AL-FEC codeword symbols included in the AL-FEC codeword block, or the SN is sequentially allocated for AL-FEC codeword symbols that are classified on a type basis among the AL-FEC codeword symbols included in the AL-FEC codeword block.

10. The method as claimed in claim 9, wherein the AL-FEC header further includes information indicating a type of the AL-FEC codeword symbol included in the AL-FEC packet if the SN is sequentially allocated for the AL-FEC codeword symbols which are classified on a type basis.

11. The method as claimed in claim 8, wherein:
  the order information includes an SN indicating an order of a related AL-FEC codeword symbol,
  the SN is sequentially allocated for all of the AL-FEC codeword symbols included in the AL-FEC codeword block, or the SN is sequentially allocated for AL-FEC codeword symbols which are classified on a type basis among the AL-FEC codeword symbols included in the AL-FEC codeword block if an AL-FEC packet transmission apparatus generates AL-FEC codeword packets, and generates the AL-FEC packets by performing a puncturing operation based on puncturing information, and
  each of the AL-FEC codeword packets includes a related AL-FEC codeword symbol and AL-FEC header.

12. The method as claimed in claim 11, wherein the AL-FEC header further includes information indicating a type of the AL-FEC codeword symbol included in the AL-FEC packet if the SN is sequentially allocated for the AL-FEC codeword symbols which are classified on a type basis.

13. The method as claimed in claim 8, wherein:
  the order information includes an SN indicating an order of a related AL-FEC codeword symbol, and
  the SN is sequentially allocated for specific AL-FEC codeword symbols among the AL-FEC codeword symbols included in the AL-FEC codeword block, or the SN is sequentially allocated for AL-FEC codeword symbols which are classified on a type basis among the specific AL-FEC codeword symbols if an AL-FEC packet transmission apparatus allocates the SN for the specific AL-FEC codeword symbols based on puncturing information.

14. The method as claimed in claim 13, wherein the AL-FEC header further includes information indicating a type of the AL-FEC codeword symbol included in the AL-FEC packet if the SN is sequentially allocated for the AL-FEC codeword symbols which are classified on a type basis.

15. An application layer-forward error correction (AL-FEC) packet transmission apparatus in a multimedia communication system, comprising:
  an AL-FEC packet generator configured to generate an AL-FEC packet; and
  a transmitter for transmitting the AL-FEC packet to an AL-FEC packet reception apparatus,
  wherein the AL-FEC packet includes AL-FEC codeword symbols and an AL-FEC header, and each of the AL-FEC codeword symbols is one of AL-FEC codeword symbols included in an AL-FEC codeword block, and
  wherein the AL-FEC header includes order information indicating an order of the AL-FEC codeword symbols included in the AL-FEC packet in the AL-FEC codeword block.

16. The AL-FEC packet transmission apparatus as claimed in claim 15, wherein:
  the order information includes a serial number (SN) indicating an order of a related AL-FEC codeword symbol, and
  the SN is sequentially allocated for all of the AL-FEC codeword symbols included in the AL-FEC codeword block, or the SN is sequentially allocated for AL-FEC codeword symbols that are classified on a type basis among the AL-FEC codeword symbols included in the AL-FEC codeword block.

17. The AL-FEC packet transmission apparatus as claimed in claim 16, wherein the AL-FEC header further includes information indicating a type of the AL-FEC codeword symbol included in the AL-FEC packet if the SN is sequentially allocated for the AL-FEC codeword symbols which are classified on a type basis.

18. The AL-FEC packet transmission apparatus as claimed in claim 15, wherein:
  the order information includes an SN indicating an order of a related AL-FEC codeword symbol,
  the SN is sequentially allocated for all of the AL-FEC codeword symbols included in the AL-FEC codeword block, or the SN is sequentially allocated for AL-FEC codeword symbols which are classified on a type basis among the AL-FEC codeword symbols included in the AL-FEC codeword block if the AL-FEC packet transmission apparatus generates AL-FEC codeword packets, and generates the AL-FEC packets by performing a puncturing operation based on puncturing information, and
  each of the AL-FEC codeword packets includes a related AL-FEC codeword symbol and AL-FEC header.

19. The AL-FEC packet transmission apparatus as claimed in claim 18, wherein the AL-FEC header further includes information indicating a type of the AL-FEC codeword symbol included in the AL-FEC packet if the SN is sequentially allocated for the AL-FEC codeword symbols which are classified on a type basis.

20. The AL-FEC packet transmission apparatus as claimed in claim 15, wherein:
  the order information includes an SN indicating an order of a related AL-FEC codeword symbol, and
  the SN is sequentially allocated for specific AL-FEC codeword symbols among the AL-FEC codeword symbols included in the AL-FEC codeword block, or the SN is sequentially allocated for AL-FEC codeword symbols which are classified on a type basis among the specific AL-FEC codeword symbols if the AL-FEC packet transmission apparatus allocates the SN for the specific AL-FEC codeword symbols based on puncturing information.

21. The AL-FEC packet transmission apparatus as claimed in claim 20, wherein the AL-FEC header further includes information indicating a type of the AL-FEC codeword symbol included in the AL-FEC packet if the SN is sequentially allocated for the AL-FEC codeword symbols which are classified on a type basis.

22. An application layer-forward error correction (AL-FEC) packet reception apparatus in a multimedia communication system, comprising:
 a receiver configured to receive an AL-FEC packet from an AL-FEC packet transmission apparatus,
 wherein the AL-FEC packet includes AL-FEC codeword symbols and an AL-FEC header, and each of the AL-FEC codeword symbols is one of AL-FEC codeword symbols included in an AL-FEC codeword block, and
 wherein the AL-FEC header includes order information indicating an order of the AL-FEC codeword symbols included in the AL-FEC packet in the AL-FEC codeword block.

23. The AL-FEC packet reception apparatus as claimed in claim 22, wherein:
 the order information includes a serial number (SN) indicating an order of a related AL-FEC codeword symbol, and
 the SN is sequentially allocated for all of the AL-FEC codeword symbols included in the AL-FEC codeword block, or the SN is sequentially allocated for AL-FEC codeword symbols that are classified on a type basis among the AL-FEC codeword symbols included in the AL-FEC codeword block.

24. The AL-FEC packet reception apparatus as claimed in claim 23, wherein the AL-FEC header further includes information indicating a type of the AL-FEC codeword symbol included in the AL-FEC packet if the SN is sequentially allocated for the AL-FEC codeword symbols which are classified on a type basis.

25. The AL-FEC packet reception apparatus as claimed in claim 22, wherein:
 the order information includes an SN indicating an order of a related AL-FEC codeword symbol,
 the SN is sequentially allocated for all of the AL-FEC codeword symbols included in the AL-FEC codeword block, or the SN is sequentially allocated for AL-FEC codeword symbols which are classified on a type basis among the AL-FEC codeword symbols included in the AL-FEC codeword block if the AL-FEC packet transmission apparatus generates AL-FEC codeword packets, and generates the AL-FEC packets by performing a puncturing operation based on puncturing information, and
 each of the AL-FEC codeword packets includes a related AL-FEC codeword symbol and AL-FEC header.

26. The AL-FEC packet reception apparatus as claimed in claim 25, wherein the AL-FEC header further includes information indicating a type of the AL-FEC codeword symbol included in the AL-FEC packet if the SN is sequentially allocated for the AL-FEC codeword symbols which are classified on a type basis.

27. The AL-FEC packet reception apparatus as claimed in claim 22, wherein:
 the order information includes an SN indicating an order of a related AL-FEC codeword symbol, and
 the SN is sequentially allocated for specific AL-FEC codeword symbols among the AL-FEC codeword symbols included in the AL-FEC codeword block, or the SN is sequentially allocated for AL-FEC codeword symbols which are classified on a type basis among the specific AL-FEC codeword symbols if the AL-FEC packet transmission apparatus allocates the SN for the specific AL-FEC codeword symbols based on puncturing information.

28. The AL-FEC packet reception apparatus as claimed in claim 27, wherein the AL-FEC header further includes information indicating a type of the AL-FEC codeword symbol included in the AL-FEC packet if the SN is sequentially allocated for the AL-FEC codeword symbols which are classified on a type basis.

\* \* \* \* \*